(12) United States Patent
Dabag et al.

(10) Patent No.: US 7,642,853 B2
(45) Date of Patent: Jan. 5, 2010

(54) HIGH-SWING OPERATIONAL AMPLIFIER OUTPUT STAGE USING ADAPTIVE BIASING

(75) Inventors: Hayg-Taniel Dabag, Bochum (DE); Dongwon Seo, San Diego, CA (US); Manu Mishra, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 64 days.

(21) Appl. No.: 11/844,314

(22) Filed: Aug. 23, 2007

(65) Prior Publication Data

US 2009/0051431 A1 Feb. 26, 2009

(51) Int. Cl.
*H03F 3/26* (2006.01)
(52) U.S. Cl. ........................................ 330/267; 330/261
(58) Field of Classification Search ........................ None
See application file for complete search history.

(56) References Cited

U.S. PATENT DOCUMENTS

| | | | | |
|---|---|---|---|---|
| 4,964,116 A * | 10/1990 | Measor | .................... | 375/229 |
| 5,006,817 A * | 4/1991 | Babanezhad | ................ | 330/253 |
| 5,294,893 A * | 3/1994 | Ryat | ......................... | 330/258 |
| 5,703,532 A * | 12/1997 | Shin et al. | ................... | 330/253 |
| 5,973,547 A * | 10/1999 | Ang et al. | .................... | 327/538 |
| 6,281,753 B1 * | 8/2001 | Corsi et al. | ................. | 330/261 |
| 6,515,547 B2 * | 2/2003 | Sowlati | ....................... | 330/311 |
| 6,747,514 B1 * | 6/2004 | Aude | .......................... | 330/253 |
| 7,135,925 B2 * | 11/2006 | Poulton | ....................... | 330/253 |
| 7,151,412 B2 * | 12/2006 | Hairston | ..................... | 330/311 |

(Continued)

FOREIGN PATENT DOCUMENTS

EP 0291062 11/1988

(Continued)

OTHER PUBLICATIONS

Dabag, et al.: "Electrical Stress-Free High Gain and High Swing Analog Buffer Using an Adaptive Biasing Scheme," Circuits and Systems, 2007, ISCAS 2007, IEEE International Symposium O N, IEEE, PI, May 1, 2007, pp. 945-948, XP031181418.

(Continued)

*Primary Examiner*—Henry K Choe
(74) *Attorney, Agent, or Firm*—Howard H. Seo; Ramin Mobarhan

(57) ABSTRACT

An output stage includes two transistors (switching transistor and biasing transistor) coupled in series in a pullup current path between a VDDA node and an output node, and also includes two transistors (switching transistor and biasing transistor) coupled in series in a pulldown current path between the output node and a ground node. Providing the biasing transistors reduces the maximum voltage dropped across the transistors, thereby allowing the transistors to have lower breakdown voltages than VDDA. An adaptive biasing circuit adjusts the gate voltage on a biasing transistor based on the output node voltage. If the output voltage is in a midrange, then the gate voltage is set farther away from a rail voltage in order to reduce voltage stress. If the output voltage is in a range closer to the rail voltage, then the gate voltage is set closer to the rail voltage, thereby facilitating rail-to-rail output voltage swings.

21 Claims, 6 Drawing Sheets

OPERATIONAL AMPLIFIER
(CIRCUIT DIAGRAM)

U.S. PATENT DOCUMENTS 7,420,417 B2 * 9/2008 Lin et al. .................. 330/277
7,421,254 B2 * 9/2008 Behzad .................. 455/115.1

FOREIGN PATENT DOCUMENTS

WO 01037425 5/2001

OTHER PUBLICATIONS

International Search Report, PCT/US2008/073928 - International Search Authority - European Patent Office, Nov. 20. 2008.

Written Opinion, PCT/US2008/073928 - International Search Authority - European Patent Office, Nov. 20, 2008.

* cited by examiner

MIXED SIGNAL IC

DIGITAL INVERTER

RAIL-TO-RAIL
OPERATIONAL AMPLIFIER

OPERATIONAL AMPLIFIER
(BLOCK DIAGRAM)

OPERATIONAL AMPLIFIER
(CIRCUIT DIAGRAM)

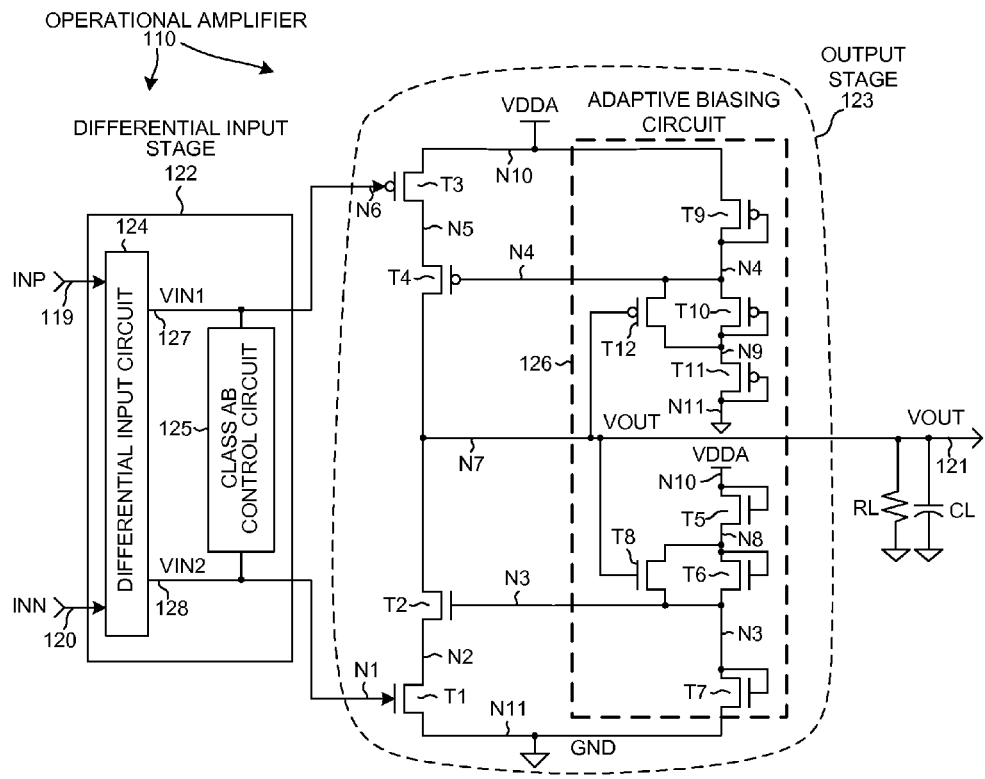

FIG. 9

| VIN1, VIN2 | HIGH | MEDIUM | LOW |
|---|---|---|---|
| VDDA | 2.6V | 2.6V | 2.6V |
| VN7 (VOUT) | 0<VOUT<(1/3)*VDDA<br><br>FIRST VOLTAGE RANGE | (1/3)*VDDA<VOUT<<br>(2/3)*VDDA<br><br>SECOND VOLTAGE RANGE | VOUT>(2/3)*VDDA<br><br>THIRD VOLTAGE RANGE |
| VN3 | (1/3)*VDDA | (1/3)*VDDA | (1/2)*VDDA |
| VN2 | (1/3)*VDDA-VGS | (1/3)*VDDA-VGS | (1/2)*VDDA-VGS |
| VN7-VN2 | 0<VN7-VN2<VGS | VGS<VN7-VN2<<br>(1/3)*VDDA+VGS | (1/6)*VDDA+VGS<<br>VN7-VN2<(1/2)VDDA+VGS |
| VN4 | (1/2)*VDDA | (2/3)*VDDA | (2/3)*VDDA |
| VN5 | (1/2)*VDDA+VGS | (2/3)*VDDA+VGS | (2/3)*VDDA+VGS |
| VN5-VN7 | (1/2)*VDDA+VGS<<br>VN5-VN7<(1/6)*VDDA+VDS | VGS<VN5-VN7<<br>(1/3)*VDDA+VGS | 0<VN5-VN7<VGS |

1. VT=VTN=|VTP| VARIES DEPENDENT ON PROCESS (300 mV TO 800 mV).
2. VGS=VGSN=|VGSP|=|VT|+|DELTA|, WHERE DELTA RANGES APPROXIMATELY 100MV TO 300 MV
3. (1/3)*VDDA OR (1/2)*VDDA IS DETERMINED BY THE RATIO OF TRANSISTORS THAT MAKE UP THE VOLTAGE DIVIDERS IN THE ADAPTIVE BIASING CIRCUIT.

FIG. 10

AC ANALYSIS - ADAPTIVE BIAS LOOP GAIN

| OUTPUT DC LEVEL (V) | NMOS LOOP GAIN (dB) | PMOS LOOP GAIN (dB) |
|---|---|---|
| 2.5 | - 72.71 | - 139.9 |
| 2.4 | - 53.65 | - 124.9 |
| 2.25 | - 38.93 | - 115 |
| 1.3 | - 29.4 | - 18.16 |
| 0.35 | - 114.5 | - 35.29 |
| 0.2 | - 116.4 | - 45.09 |
| 0.1 | - 124.3 | - 57.92 |

RL = 1K OHM
CL = 1N FARAD

FIG. 11

DISTORTION COMPARISON

| SINUSOID INPUT SIGNALS | WITHOUT ADAPTIVE BIASING (DB) | WITH ADAPTIVE BIASING (DB) | PERCENT CHANGE |
|---|---|---|---|
| $40mV \sin(2\pi \cdot 10kHz \cdot t) + 0.48V$ | 100.9 | 99.4 | 1.49 % |
| $40mV \sin(2\pi \cdot 100kHz \cdot t) + 0.48V$ | 82.4 | 79.7 | 3.37 % |
| $40mV \sin(2\pi \cdot 1MHz \cdot t) + 0.48V$ | 52.3 | 48.7 | 7.27 % |
| $400mV \sin(2\pi \cdot 10kHz \cdot t) + 0.48V$ | 80.7 | 79.4 | 1.65 % |
| $400mV \sin(2\pi \cdot 100kHz \cdot t) + 0.48V$ | 58.6 | 55.2 | 6.01 % |
| $400mV \sin(2\pi \cdot 1MHz \cdot t) + 0.48V$ | 28.9 | 24.7 | 16.6 % |

FIG. 12

HIGH-SWING OPERATIONAL AMPLIFIER OUTPUT STAGE USING ADAPTIVE BIASING

BACKGROUND INFORMATION

1. Technical Field

The disclosed embodiments relate to operational amplifiers, and more particularly relate to operational amplifiers suitable for rail-to-rail operation in analog/mixed signal integrated circuits.

2. Background Information

FIG. 1 (Prior Art) is a diagram of a mixed signal integrated circuit 1. Mixed signal integrated circuit 1 includes a digital logic portion 2 and an analog circuitry portion 3. The analog circuitry may, for example, include circuitry whose analog signals swing over voltage ranges that are bigger than the swings of the digital signals within the digital logic portion 2.

FIG. 2 (Prior Art) is a circuit diagram of a representative complementary logic digital inverter 4 within portion 2. Inverter 4 includes a thin gate insulator P-channel transistor 5 and a thin gate insulator N-channel transistor 6. These thin gate insulator transistors are sometimes referred to as "baseline devices" because they are the standard logic transistors that make up the majority of the transistors on integrated circuit 1. In the illustrated example, the digital logic within portion 2 operates from a digital logic supply voltage referred to here as VDD. Supply voltage VDD in this example ranges from about 1.0 volts to 1.3 volts. The thin gate insulator transistors have drain-to-source and gate-to-source breakdown voltages of approximately 2.0 volts or are otherwise specified to operate with drain-to-source voltages (Vds) and a gate-to-source voltages (Vgs) of 2.0 volts or less. Because supply voltage VDD is less than 2.0 volts, the complementary logic circuitry such as the circuit of FIG. 2 operates satisfactorily and does not suffer reliability problems due to overstressing of the logic transistors.

The circuitry of mixed signal integrated circuit 1, however, also includes analog circuitry in portion 3. The analog circuitry may, for example, include input/output (I/O) circuitry for interfacing the digital logic to other circuitry outside integrated circuit 1. Such analog circuitry typically operates from a higher supply voltage. The higher supply voltage is referred to here as analog supply voltage VDDA.

FIG. 3 (Prior Art) is an example of such an analog circuit referred to here as a "rail-to-rail operational amplifier" 7. In this example of an application of the rail-to-rail amplifier 7, a single-ended digital input signal VIN is supplied onto the non-inverting differential input lead 8. The digital signal has a voltage swing of from approximately ground potential to the digital logic supply voltage VDD (in this example, from ground potential to 1.3 volts). Dashed line 16 represents a negative feedback loop. Output signal VOUT on output lead 9 has a voltage swing from approximately ground potential to the analog supply voltage VDDA (in this example, from ground potential to 2.6 volts). Operational amplifier 7 includes a differential input stage 10 and an output stage 11. Differential input stage 10 includes a differential input circuit 12 and a class AB control circuit 13.

FIG. 4 (Prior Art) shows the output stage 11 of the operational amplifier 7 of FIG. 3 in further detail. Output stage 11 includes a P-channel transistor 14 and an N-channel transistor 15. Because the voltage of the output signal VOUT on output lead 9 can range from ground potential to 2.7 volts, using baseline thin gate insulator devices for transistors 14 and 15 that have breakdown voltage ratings of 2.0 volts would subject the devices to overstress. Transistors 14 and 15 could experience drain-to-source voltages (Vds) of 2.7 volts, when the baseline devices have rated drain-to-source breakdown voltages (Vdsbd) of approximately 2.0 volts. Transistors 14 and 15 are therefore made to be thick gate insulator transistors that have higher breakdown voltages. In one example, the thick gate insulator transistors have a Vdsbd breakdown voltage of approximately 3.0 volts. They are therefore able to withstand the stresses imposed by the higher analog supply voltage VDDA range signals on output lead 9.

The circuitry of FIGS. 1-4 works well. Unfortunately, providing transistors with two different gate insulator thicknesses increases the processing cost of making the mixed signal integrated circuit 1. Fabricating the thick gate insulator output stage transistors 14 and 15 generally requires using additional lithography masks, and requires carrying out multiple additional semiconductor fabrication processing steps. Due to this additional complexity, the cost of making mixed signal integrated circuit 1 may be increased by as much as five percent or more due to the requirement of having to provide the thick oxide output stage transistors.

SUMMARY

An output stage of an operational amplifier includes two transistors (a switching transistor and a biasing transistor) coupled in series in a pullup current path between an analog supply voltage VDDA node and an output node. The VDDA node is sometimes referred to as the VDDA supply rail. The output stage also includes two transistors (a switching transistor and a biasing transistor) coupled in series in a pulldown current path between the output node and ground GND node. The ground GND node is sometimes referred to as the GND rail. The switching transistors are controlled by a class AB control circuit in a preceding differential input stage of the operational amplifier.

Providing the biasing transistors in the pullup and pulldown current paths of the output stage reduces the maximum voltage dropped across the switching transistors, thereby allowing the biasing and switching transistors to have lower rated breakdown voltages than the magnitude of supply voltage VDDA. In one example, all the switching and biasing transistors of the output stage are baseline field effect transistor devices that have the same gate insulator thicknesses and have the same approximate drain-to-source breakdown voltages (Vdsbd) and the same approximate gate-to-source breakdown voltages (Vgsbd). Rather than biasing the biasing transistors with fixed gate voltages, a novel adaptive biasing circuit within the output stage adjusts the gate voltages of biasing transistors based at least in part on the magnitude of the output signal VOUT on the output node. The biasing and switching transistors are maintained in their saturation regions so that the operational amplifier has a high voltage gain.

In one specific embodiment, the adaptive biasing works as follows. If, for example, the output signal VOUT is in a first voltage range (for example, a low voltage range that is less than one third of VDDA), then the gate voltage on the N-channel biasing transistor in the pulldown current path is set to be a first bias voltage. The first bias voltage is close to the GND rail voltage so that the switching and biasing transistors in the pulldown current path can pull the output node closer to the ground voltage on the GND voltage rail, thereby facilitating a voltage swing of the output voltage VOUT down close to the voltage of the GND rail. If, however, VOUT is in a second voltage range (for example, a voltage range that is higher than one third of VDDA), then the gate voltage on the biasing transistor in the pulldown current path is set to be a second bias voltage. The second bias voltage is farther away from the GND potential on the GND rail. Increasing the voltage on the gate of the biasing transistor in this way reduces voltage stress on the switching and biasing transistors in the pulldown current path. The P-channel biasing transistor in the pullup current path is biased by the adaptive biasing circuit in a complementary fashion to how the N-channel biasing transistor in the pulldown current path is biased. Accordingly, the gate of the P-channel biasing transistor is biased with one of two biasing voltages, depending on the magnitude of the output signal VOUT. Adjusting the gate voltages that bias the biasing transistors as the magnitude of the output signal VOUT increases and decreases introduces distortion into the output signal VOUT. The overall distortion of the operational amplifier is, however, acceptable for many operational amplifier applications.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 9 is diagram of the novel operational amplifier of FIG. 8. The diagram shows the novel output stage of the operational amplifier in an expanded fashion.

FIG. 10 is a table that sets forth what the voltages are on the various nodes within the output stage of FIG. 9 under three different operating conditions. Although operation of the output stage illustrated in FIG. 9 is explained in the corresponding text in association with VOUT voltage ranges and particular node voltages, it is to be understood that the description of the circuit's operation is simplified for illustrative and instructional purposes. For more precise circuit operation when using particular types of transistors and circuit components, the actual circuit should be simulated using a circuit simulator (for example, SPICE) and accurate device models.

FIG. 11 is a table that sets forth the loop gain of the adaptive bias feedback loops within the output stage of FIG. 9. There is a first feedback loop that controls the bias voltage on the gate of biasing transistor T4, and there is a second feedback loop that controls the bias voltage on the gate of biasing transistor T2.

FIG. 12 is a table that sets forth the signal distortion introduced by the novel operational amplifier of FIG. 9.

DETAILED DESCRIPTION

Figure 5:
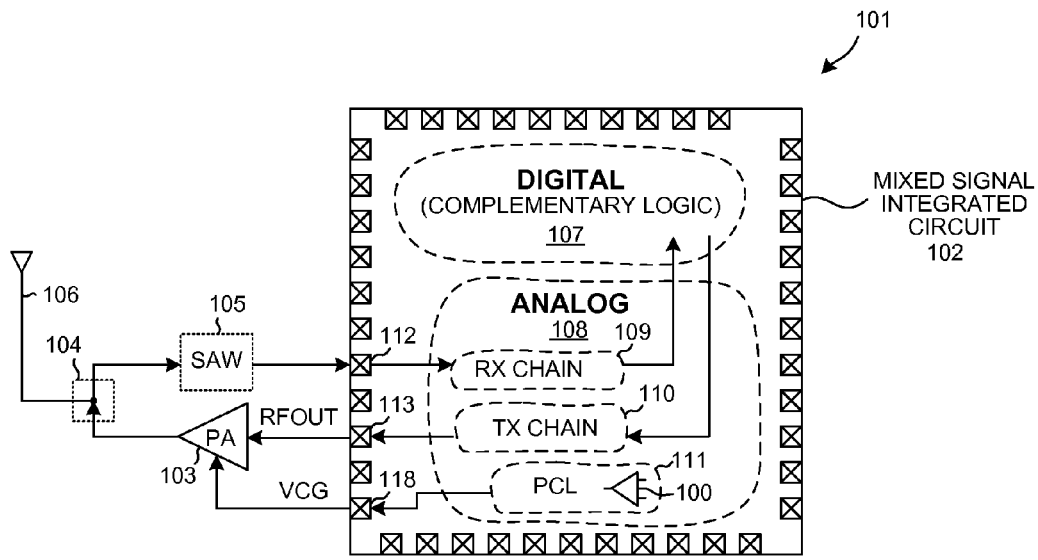
FIG. 5 is a diagram of one exemplary application of a novel operational amplifier in accordance with one novel aspect.

FIG. 5 is a simplified circuit diagram of one exemplary application of a novel operational amplifier 100 in a cellular telephone system 101 in accordance with one novel aspect. Cellular telephone system 101 includes (among other parts not illustrated) a mixed signal integrated circuit 102, a discrete power amplifier integrated circuit 103, a diplexer 104, a SAW filter 105, and an antenna 106. Mixed signal integrated circuit 102 includes a digital logic portion 107 and an analog circuitry portion 108. Analog circuitry portion 108 includes receiver chain circuitry 109, transmitter chain circuitry 110, and power control loop (PCL) circuitry 111. The novel operational amplifier 100 is part of PCL 111. Information received onto the cellular telephone is received onto antenna 106, and passes through diplexer 104, through SAW filter 105, through terminal 112, and into the receiver chain 109 portion of analog circuitry portion 108. Information to be transmitted from the cellular telephone passes from the transmitter chain 110, through terminal 113, through power amplifier 103, through diplexer 104, and is transmitted from antenna 106. The gain of the power amplifier 103 is controlled by PCL 111 by a voltage control gain (VCG) signal that is output from the mixed signal integrated circuit via terminal 118.

Digital logic portion 107 operates from a digital logic supply voltage referred to here as supply voltage VDD. Analog circuitry portion 108 operates from an analog supply voltage referred to here as supply voltage VDDA. Supply voltage VDDA is greater than the digital logic supply voltage VDD. In the present example, the digital supply voltage VDD ranges from about 1.0 volts to 1.3 volts. The analog supply voltage VDDA ranges from about 2.5 volts to 2.7 volts and has a nominal value of 2.6 volts. The voltage swings of analog signals processed in the analog circuitry portion 108 exceed VDD in magnitude, yet all the field effect transistors of portions 107 and 108 are baseline devices having the same relatively thin gate insulator thicknesses. The drain-to-source breakdown voltage (Vdsbd) of these baseline devices in this present example is 2.0 volts. Similarly, the gate-to-source breakdown voltage (Vgsbd) of these baseline devices is 2.0 volts. The term "breakdown voltage" here does not mean that the baseline devices will necessarily fail immediately if subjected to the breakdown voltage, but rather the term breakdown voltage is a reliability metric. In one example, the breakdown voltage is the lowest voltage that causes the baseline devices to suffer a shift in an operational parameter (for example, threshold voltage) of ten percent if the transistor is operated in the stressed condition at the breakdown voltage for a specified operational period (for example, ten years).

Figure 6:
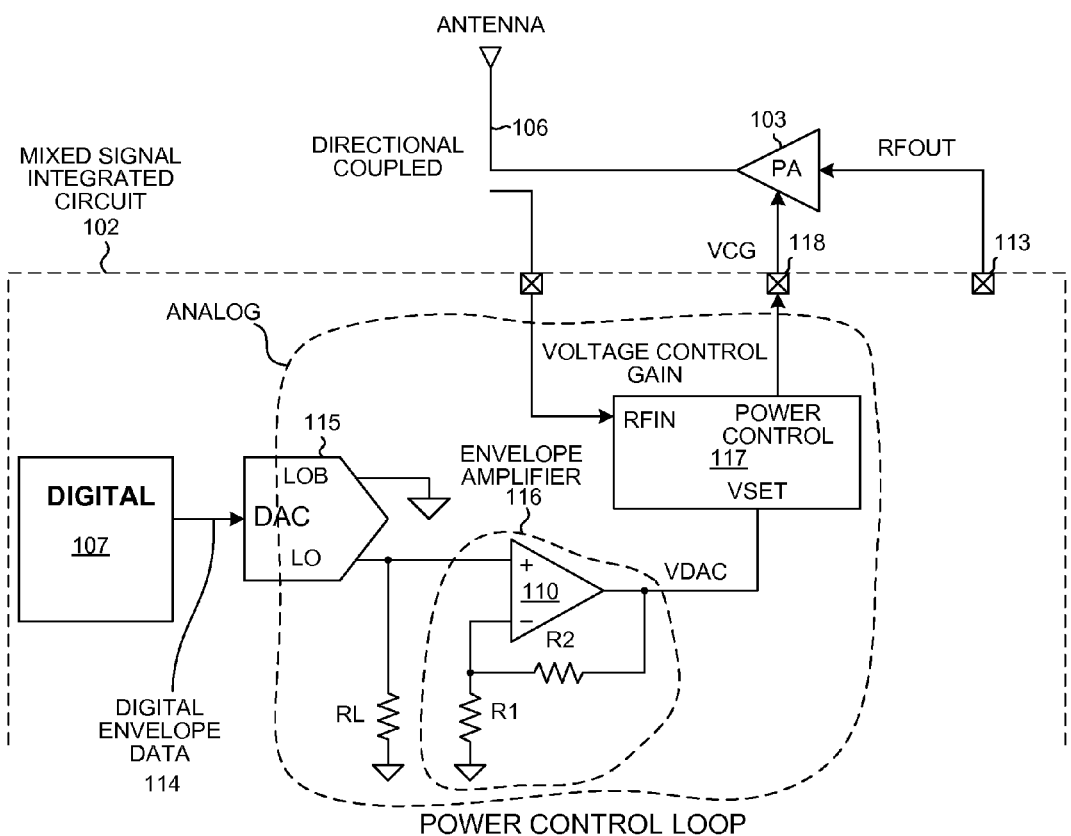
FIG. 6 is a diagram of the power control loop circuitry in the mixed signal integrated circuit of FIG. 5. The power control loop involves the novel operational amplifier.

FIG. 6 is a diagram that shows PCL 111 of FIG. 5 in further detail. Digital envelope data 114 originates in digital portion 107 and is converted into an analog signal by a digital-to-analog converter (DAC) 115. The resulting analog signal passes through envelope amplifier 116 to generate a digital signal VDAC. Signal VDAC is supplied to a power control block 117. Envelope amplifier 116 includes the novel operational amplifier 110 that is configured to involve a negative feedback loop. Power control block 117 receives a signal indicative of the strength of the RF signal on antenna 106 and, based on that signal and the digital signal VDAC from envelope amplifier 116, outputs the voltage control gain signal (VCG) from terminal 118. The VCG signal controls the gain of power amplifier 103.

Figure 7:
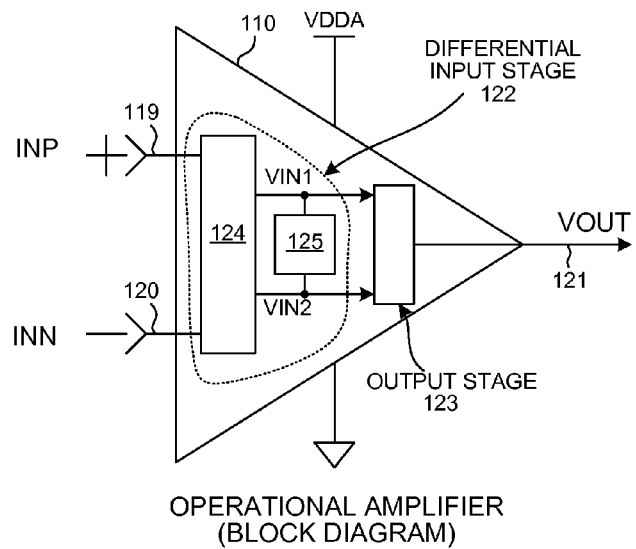
FIG. 7 is a block diagram of the novel operational amplifier that is part of the power control loop of FIG. 6.

FIG. 7 is a block diagram of novel operational amplifier 110 of FIG. 6. Operational amplifier 110 includes a non-inverting differential input node and lead 119, an inverting differential input node and lead 120, an output node and lead 121, a differential input stage 122, and an output stage 123. Differential input stage 122 in turn includes a differential input circuit 124 and a class AB control circuit 125. Operational amplifier 110 is powered from the analog supply voltage VDDA as illustrated.

Figure 8:
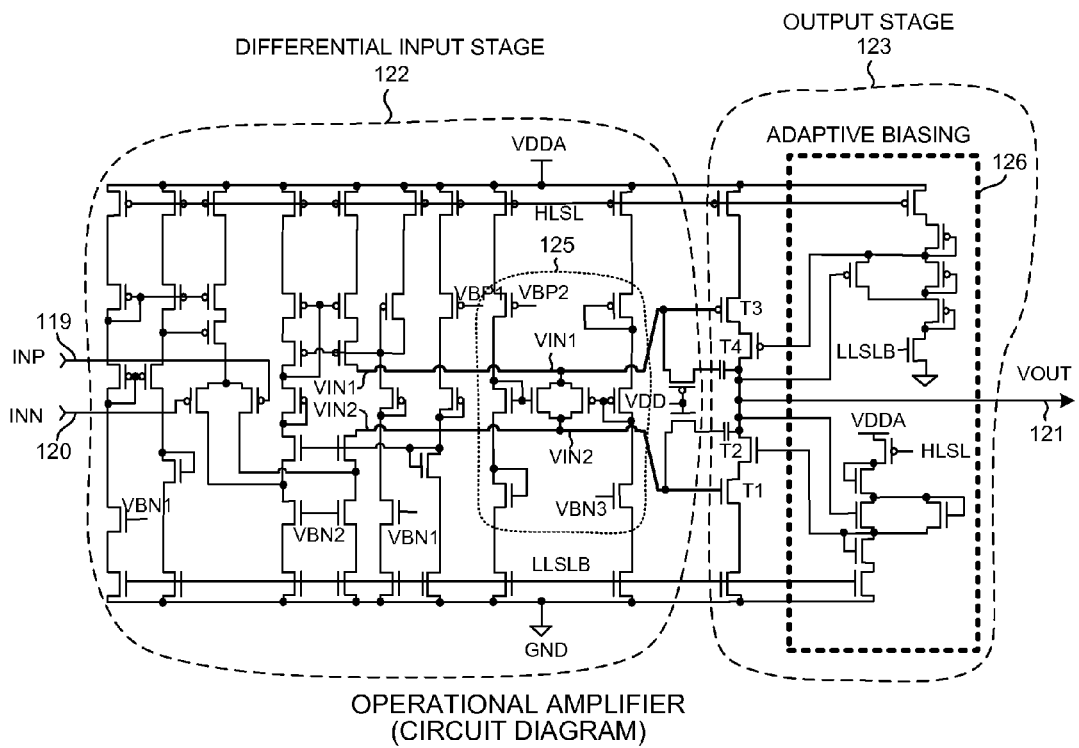
FIG. 8 is a more detailed circuit diagram of the novel operational amplifier of FIG. 7.

FIG. 8 is a more detailed diagram of operational amplifier 110 of FIG. 7. Output stage 123 includes two switching field effect transistors T1 and T3, two additional novel biasing field effect transistors T2 and T4, and a novel adaptive biasing circuit 126. The top row of transistors and the bottom row of transistors are controlled by high and low sleep signals HLSL and LLSLB, respectively. Signal LLSLB is active low. In one embodiment, the switching and biasing transistors are of substantially identical size and identical construction.

Figure 1:
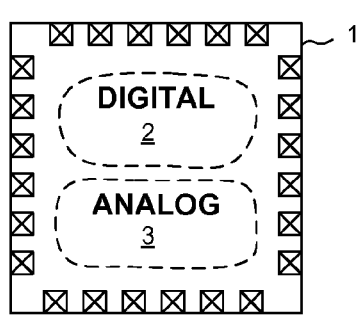
FIG. 1 (Prior Art) is a diagram of a mixed signal integrated circuit that includes both thick gate insulator transistors as well as thin gate insulator transistors.
Figure 2:
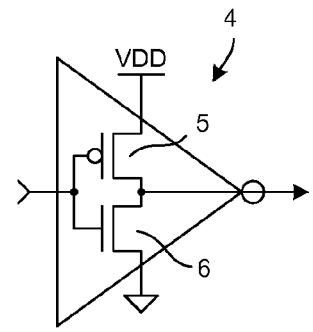
FIG. 2 (Prior Art) is a diagram of a digital inverter located within the digital portion of the mixed signal integrated circuit of FIG. 1.
Figure 3:
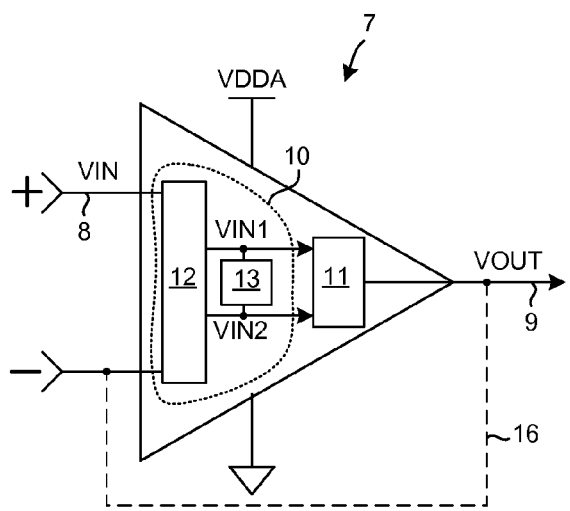
FIG. 3 (Prior Art) is a diagram of a rail-to-rail operational amplifier located within the analog portion of the mixed signal integrated circuit of FIG. 1.
Figure 4:
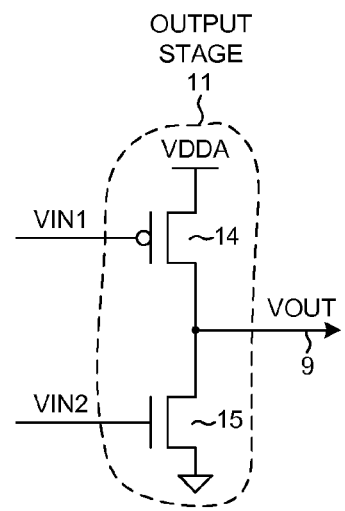
FIG. 4 (Prior Art) is a diagram of the output stage of the rail-to-rail operational amplifier of FIG. 3.

FIG. 9 is a simplified block diagram that shows output stage 123 at the transistor level. Whereas in the prior art output stage 11 of FIGS. 3 and 4, there is a single N-channel pulldown transistor 15 in a pulldown current path from output node 9 to a ground node and there is a single P-channel pullup transistor 14 in a pullup current path from the VDDA supply voltage node to output node 9, in the novel circuit of FIG. 9 the two additional biasing transistors T2 and T4 are provided. N-channel biasing transistor T2 is disposed in the pulldown current path between output node N7 and ground node N11 so that the pulldown current flows in series from output node N7, through added biasing transistor T2, through switching transistor T1, and to ground node N11. Similarly, P-channel biasing transistor T4 is disposed in the pullup current path between VDDA supply node N10 and the output node N7 so that the pullup current flows from VDDA supply node N10, through switching transistor T3, through added biasing transistor T4, and to output node N7. Providing the biasing transistors T2 and T4 allows the relatively large possible voltage due to the large analog signal voltage swing on the output node N7 to be dropped across two series-connected transistors rather than just one. By dropping the large voltage across two transistors, the maximum voltage drop across each of the transistors is made small enough that both transistors can be made to be baseline devices that have rated Vdsbd and Vgsbd breakdown voltages that are smaller than the analog signal voltage swing. Because all the transistors of output stage 123 can be made to have the same gate insulator thickness, semiconductor processing costs associated with having to provide transistors with two different gate insulator thicknesses are avoided. Integrated circuit 102 is made using a standard digital complementary logic (sometimes referred to as Complementary Metal Oxide Semiconductor or CMOS) semiconductor fabrication process. As set forth above, in one embodiment, all N-channel and P-channel field effect transistors in mixed signal integrated circuit 102 are of the same baseline type and have the same gate insulator thicknesses.

Rather than driving the gate of a biasing transistor with a fixed bias voltage, adaptive biasing circuit 126 adjusts the bias voltages on the gates of the biasing transistors T3 and T4 to prevent voltage overstress on the biasing transistors and to facilitate rail-to-rail output voltage swings on output node N7. If, for example, the output signal VOUT on output node N7 is such that a large voltage is to be dropped across the biasing transistor, then the biasing voltage on the gate of the biasing transistor is set such that the drain-to-source voltage (Vds) and the gate-to-source voltage (Vgs) on the biasing transistor are reduced and are less than rated Vdsbd and Vgsbd breakdown voltages. If, however, the output signal VOUT is such that the voltage drop across the biasing transistor is to be minimized such as when the biasing transistor is pulling the voltage on output node N7 to a supply voltage rail, then the biasing voltage on the gate of the biasing transistor is set to be closer to the voltage on the rail. Setting the gate voltage on the biasing transistor closer to the voltage on the rail allows the biasing transistor and its associated switching transistor can pull the voltage on output node N7 closer to the rail voltage, thereby facilitating output signal swings that are substantially rail-to-rail in magnitude.

Operation of operational amplifier 110 is explained in further detail below in connection with FIGS. 9 and 10. Differential input stage 122 receives the voltage signal INP on non-inverting differential input node 119 and receives the voltage signal INN on inverting differential input node 120. Differential input stage 122 multiplies the voltage difference between INP and INN by a gain and outputs the result onto node 127 as signal VIN1. The result is also output onto node 128 as signal VIN2. The two signals VIN1 and VIN2 have a voltage offset with respect to each other, but track one another such that if VIN1 increases, then VIN2 increases as well. If VIN1 decreases, then VIN2 decreases as well. The voltage offset is controlled by class AB control circuit 125 such that when the two signals VIN1 and VIN2 are supplied onto switching transistors T3 and T1 of output stage 123, the output stage 123 operates as a class AB amplifier.

Operation of output stage 123 is described below under three different operating conditions. In the first operating condition, the signals VIN1 and VIN2 have relatively high voltages and the voltage of the output signal VOUT on node N7 is low in a first voltage range. In the present example, the first voltage range extends from ground potential to approximately one third of the supply voltage VDDA. In the second operating condition, the signals VIN1 and VIN2 have midrange voltages and the voltage of the output signal VOUT is in a second voltage range. The second voltage range extends from approximately one third of the supply voltage VDDA to approximately two thirds of the supply voltage VDDA. In the third operating condition, the signals VIN1 and VIN2 have relatively low voltages and the voltage of the output signal VOUT is high in a third voltage range. The third voltage range extends from approximately two thirds of the supply voltage VDDA to the supply voltage VDDA.

FIG. 10 is a table that sets forth the voltages on the various nodes of output stage 123 in each of these three operating conditions. For example, the second column from the left sets forth circuit operation in the first operating condition. The next column to the right sets forth circuit operation in the second operating condition. The rightmost column sets forth circuit operation in the third operating condition. As FIG. 10 indicates, in the presently described example the supply voltage VDDA has a nominal value of 2.6 volts.

OPERATION IN FIRST VOUT RANGE: Adaptive biasing circuit 126 includes two voltage divider circuits. The first voltage divider circuit is a string of three diode-connected N-channel field effect transistors T5, T6 and T7. The three diode-connected transistors T5, T6 and T7 are connected in series between a VDDA supply voltage node N10 and a ground potential node N11. When current is flowing through the first voltage divider circuit and when an associated bias-adjusting transistor T8 is non-conductive, the voltage on node N3 is approximately one third of VDDA and the voltage on node N8 is approximately two thirds of VDDA.

The second voltage divider circuit is a similar string of three diode-connected P-channel transistors T9, T10 and T11. When current is flowing through the second voltage divider from VDDA supply node N10 to ground node N11 and when associated bias-adjusting transistor T12 is non-conductive, the voltage on node N9 is approximately one third of VDDA and the voltage on node N4 is approximately two thirds of VDDA.

In the first VOUT range, the voltage VOUT is less than one third of the supply voltage VDDA. This voltage VOUT is present on the gate of N-channel transistor T8. The gate-to-source voltage on transistor T8 is therefore below its threshold voltage and transistor T8 is non-conductive. The voltage on node N3 is therefore approximately one third of the supply voltage VDDA due to the operation of the first voltage divider. The voltage of one third of VDDA is supplied by the adaptive biasing circuit 126 onto the gate of the biasing transistor T2. Biasing transistor T2 is therefore conductive. As indicated by the table of FIG. 10, the voltage on the source of biasing transistor T2 at node N2 is a gate-to-source voltage drop (Vgs) less than the one third VDDA voltage present on the gate of transistor T2. As indicated by the table of FIG. 10, the Vgs voltage drop is approximately equal to the threshold voltage (Vt) of N-channel transistor T2 plus a delta amount, where the delta amount is between one hundred millivolts and three hundred millivolts. The threshold voltage is process dependent but is in the range of between three hundred millivolts to eight hundred millivolts in this example. In a situation in which the Vgs drop across biasing transistor T2 is seven hundred millivolts, the voltage on node N2 is one third of VDDA minus seven hundred millivolts. The voltage on node N2 is therefore approximately 166 millivolts. The relatively high voltage VIN2 on the gate of transistor T1 causes transistor T1 to be conductive. Accordingly, transistors T1 and T2 are both conductive and a pulldown current path is established from output node N7, through biasing transistor T2, through switching transistor T1, and to ground node N11.

The P-channel biasing transistor T4, the P-channel switching transistor T3 and the second voltage divider circuit of P-channel transistors T9-T11 work in a complementary fashion. Because VOUT is in the first voltage range (less than one third of VDDA), a large gate-to-source voltage exists on bias-adjusting transistor T12 and bias-adjusting transistor T12 is conductive. Bias-adjusting transistor T12 therefore effectively shorts the diode-connected P-channel transistor T10 of the second voltage divider circuit. Rather than there being three diode-connected transistors in the current path through the second voltage divider, there are only two. Current flows from VDDA node N10, through diode-connected transistor T9, through conductive bias-adjusting transistor T12, through diode-connected transistor T11, and to ground node N11. The voltage on node N4 is therefore approximately one half of VDDA. The voltage on node N5 is one half of VDDA plus the gate-to-source voltage drop (Vds) across transistor T4. Assuming that Vgs is seven hundred millivolts, then the voltage on node N5 is approximately 2.0 volts. Because the voltage of signal VIN1 is relatively high, the pullup current path through P-channel switching transistor T3 and P-channel biasing transistor T4 from node N10 to output node N7 is relatively nonconductive as compared to the pulldown current path through N-channel transistors T1 and T2 from output node N7 to ground node N11. The N-channel transistors T1 and T2 can therefore pull the voltage on node N7 down to the ground potential on node N11. Because the voltage on node N3 is low at approximately one third VDDA, N-channel transistors T1 and T2 can pull the voltage on output node N7 down to or close to the voltage on the ground node N11. The ground node N11 is referred to here as the ground "rail".

In this first VOUT range, the voltage on node N5 is approximately 2.0 volta as set forth above. If the voltage of signal VOUT on node N7 is at its lowest zero volts, then the drain-to-source voltage Vgs across biasing transistor T4 is at its rated 2.0 volts breakdown voltage.

OPERATION IN SECOND VOUT RANGE: In the second VOUT range, the voltage VOUT is greater than one third of VDDA but is less than two thirds of VDDA. If all current flows through all three of the diode-connected transistors of the first voltage divider, then the voltage on node N3 is approximately one third of VDDA. Because VOUT is supplied onto the gate of transistor T8 and because VOUT is greater than one third of VDDA but is less than two thirds of VDDA, there is an inadequate gate-to-source voltage (Vgs) on transistor T8 to make bias-adjusting transistor T8 conductive. The threshold voltage of transistor T8 in this example is approximately five hundred millivolts. Because bias-adjusting transistor T8 is non-conductive, the diode-connected transistor T6 in the first voltage divider is not short circuited, current flows through all three diode-connected transistors T5, T6 and T7, and the voltage on node N3 is approximately one third of VDDA.

VOUT in the second range is higher than it was in the first range. The voltage VOUT on the gate of bias-adjusting transistor T12 is no longer low enough to keep the gate-to-source voltage of transistor T12 greater than its threshold voltage. Transistor T12 is therefore no longer conductive. Current flow through the P-channel voltage divider therefore flows through all three diode-connected transistors T9, T10 and T11. The voltage on node N4 is therefore two thirds of VDDA as indicated by the table of FIG. 10. It is therefore seen that the voltage on node N4 is raised in comparison to operation in the first VOUT range.

As indicated by the table of FIG. 10, the maximum drain-to-source voltage across biasing transistor T2 in this second voltage range is approximately one third VDDA plus Vgs. As explained above, this voltage is approximately 2.0 volts in the present example. Similarly, the maximum drain-to-source voltage across bias transistor T4 in this second voltage range is approximately one third VDDA plus Vgs. The maximum Vds across bias transistor T4 is therefore also approximately 2.0 volts in this example. The maximum Vds across biasing transistors T2 and T4 is therefore within the rated Vdsbd breakdown voltage of 2.0 volts.

OPERATION IN THIRD VOUT RANGE: In the third VOUT range, the voltage VOUT is greater than two thirds of VDDA. The voltage on the gate of bias-adjusting transistor T8 is now of sufficient magnitude that the threshold voltage of transistor T8 is exceeded. Bias-adjusting transistor T8 is therefore conductive. Biasing-adjusting transistor T8 being conductive effectively short circuits the center diode-connected transistor T6 of the N-channel first voltage divider. Current flow through the first divider therefore flows from VDDA node N10, through diode-connected transistor T5, through conductive bias-adjusting transistor T8, through diode-connected transistor T7, and to ground node N11. The voltage on node N3 is therefore increased to one half of VDDA as compared to one third of VDDA in the first and second VOUT ranges. The voltage on node N2 is therefore one half of VDDA minus the gate-to-source voltage (Vgs) of transistor T2. If Vgs of transistor T2 is seven hundred milliamperes, then the voltage on node N2 is approximately six hundred milliamperes. It is therefore seen that the voltage on node N2 is increased as compared to the voltage on node N2 in the first and second VOUT ranges. This reduces the maximum drain-to-source voltage (Vds) that can exist across the biasing transistor T2 to about 2.0 volts. The maximum Vds of 2.0 volts is within the rated Vdsbd breakdown voltage of 2.0 volts.

Operation of the P-channel portion of adaptive biasing circuit 126 in the third VOUT range is similar to its operation in the second VOUT range. The high voltage of VOUT is so high that bias-adjusting transistor T12 remains nonconductive. Diode-connected transistor T10 therefore remains in the current path through the P-channel voltage divider, and the voltage on node N4 is approximately two thirds VDDA as indicated in the table of FIG. 10. Because the voltage on the gate of biasing transistor T4 is this higher biasing voltage (two thirds VDDA as compared to one half VDDA), the biasing transistor T4 and the switching transistor T3 can pull the voltage on output node N7 up and closer the to VDDA "rail" voltage. In the example described here, the voltage on node N5 is two thirds VDDA plus Vgs. If Vgs is seven hundred millivolts, then the voltage on node N5 is approximately 2.5 volts.

OUTPUT VOUT SWING: The minimum and maximum values of VOUT are given by equations (1) and (2) below.

$$\text{VOUT\_min} = VDDA \frac{V_{gs\_T7}}{V_{gs\_T7} + V_{gs\_T6} + V_{gs\_T5}} - V_{gs\_T2} + V_{ds\_T2} \quad (1)$$

$$\text{VOUT\_max} = VDDA \frac{|V_{gs\_T10} + V_{gs\_T11}|}{|V_{gs\_T10} + V_{gs\_T9} + V_{gs\_T11}|} + |V_{gs\_T4}| - |V_{ds\_T4}| \quad (2)$$

GAIN: In order for operational amplifier 110 to have a high voltage gain $A_v$, transistors T1, T2, T3, and T4 should remain in saturation. Neglecting RL, the voltage gain $A_v$ of output stage 123 is proportional to $g_m \cdot R_{output}$. The resistance seen at output node N7 is boosted by $(1+g_m \cdot R_{DS})$. The following equations summarize the gain analysis.

$$A_v = (g_{m\_T1} + g_{m\_T1}) R_{output} \quad (3)$$

$$R_{output} = R_{up} \| R_{down} \quad (4)$$

$$R_{down} = r_{out\_T2}(1 + g_{m\_T2} \cdot r_{out\_T1}) \quad (5)$$

$$R_{up} = r_{out\_T4}(1 + g_{m\_T4} \cdot r_{out\_T3}) \quad (6)$$

In the first operating condition, bias-adjusting transistor T8 is off and the biasing voltage on node N3 is one third VDDA. In this working condition, the bias voltage on N3 should be high enough to keep switching transistor T1 and biasing transistor T2 in saturation. In the second operating condition, biasing transistor T8 is turned on and short circuits the middle diode-connected transistor T6 of the first voltage divider. This increases the voltage on node N3 and hence also increases the voltage on node N2. The voltage variation of node N2 between operation in the first and second operating conditions is mainly determined by the ratio of bias-adjusting transistor T8 and diode-connected transistor T6. The size of diode-connected transistor T5 determines the maximum voltage on node N2. The size of diode-connected transistor T7 determines the minimum voltage on node N2. The transistors of the output stage are sized to guarantee that working conditions stay within rated breakdown voltages for the transistors used. The same sizing considerations are applied to the sizing of the P-channel transistors T9-T11 of the second voltage divider circuit. The adaptive biasing technique disclosed is easy to implement, scalable and power efficient.

FIG. 11 is a table that sets forth the gain of adaptive bias feedback loops within output stage 123 of FIG. 9 when output stage 123 is loaded with resistance RL and capacitance CL. RL is one kiloohm. CL is one nanofarad. The loop labeled "NMOS LOOP GAIN" in FIG. 11 refers to the feedback loop that extends from the gate of bias-adjusting transistor T8, through bias-adjusting transistor T8, to node N3, and through biasing transistor T2, and to node N7. The loop labeled "PMOS LOOP GAIN" in FIG. 11 refers to the feedback loop that extends from the gate of bias-adjusting transistor T12, through bias-adjusting transistor T12, to node N4, and through biasing transistor T4, and to node N7. Including the adaptive biasing circuit 126 and the biasing transistors T2 and T4 causes the gain of the output stage 123 to differ slightly from the gain of a conventional class AB output stage design, but nevertheless the gain remains high enough at both high and low VOUT levels. As indicated by FIG. 11, loop gain is always less than unity. The feedback loops therefore do not oscillate. Operational amplifier 110 has an output voltage swing of at least 2.4 volts, when operated from a VDDA supply voltage of 2.6 volts.

FIG. 12 is a table that sets forth the distortion introduced into a sinusoidal signal passing through operational amplifier 110. In the illustrated example of FIG. 9, the adaptive biasing circuit 126 sets the bias signals on the gates of each of the biasing transistors T2 and T4 to have one of two discrete biasing voltages: one third of supply voltage VDDA, or one half of supply voltage VDDA. As the output voltage VOUT changes in response to a changing input voltage VIN on the input of the operational amplifier, the adaptive biasing circuit 126 may change the biasing voltages on nodes N3 and N4 from one discrete biasing voltage to another in a somewhat abrupt manner. Such abrupt changes in the biasing voltages give rise to distortion in the output signal VOUT. The table of FIG. 12 compares the distortion introduced by an operational amplifier 110 that includes the novel adaptive biasing circuit 126 to the distortion introduced by an otherwise identical operational amplifier that does not have the novel adaptive biasing circuit 126. Distortion is set forth for sinusoidal input signals of frequencies ranging from 10 kHz to 1 MHz. As indicated in FIG. 12, the difference in distortion is less than 4 dB and can be neglected for many applications of an operational amplifier. For example, this increase of 4 dB of signal distortion is acceptable for the application described above in connection with FIGS. 5-9 where operational amplifier 110 is functioning as a voltage follower to buffer the signal output from a digital-to-analog converter. The differential input stage 122 has an open loop voltage gain of approximately 100 (40 dB) and the output stage 123 has an open loop voltage gain of approximately 1000 (60 dB).

Figure 13:
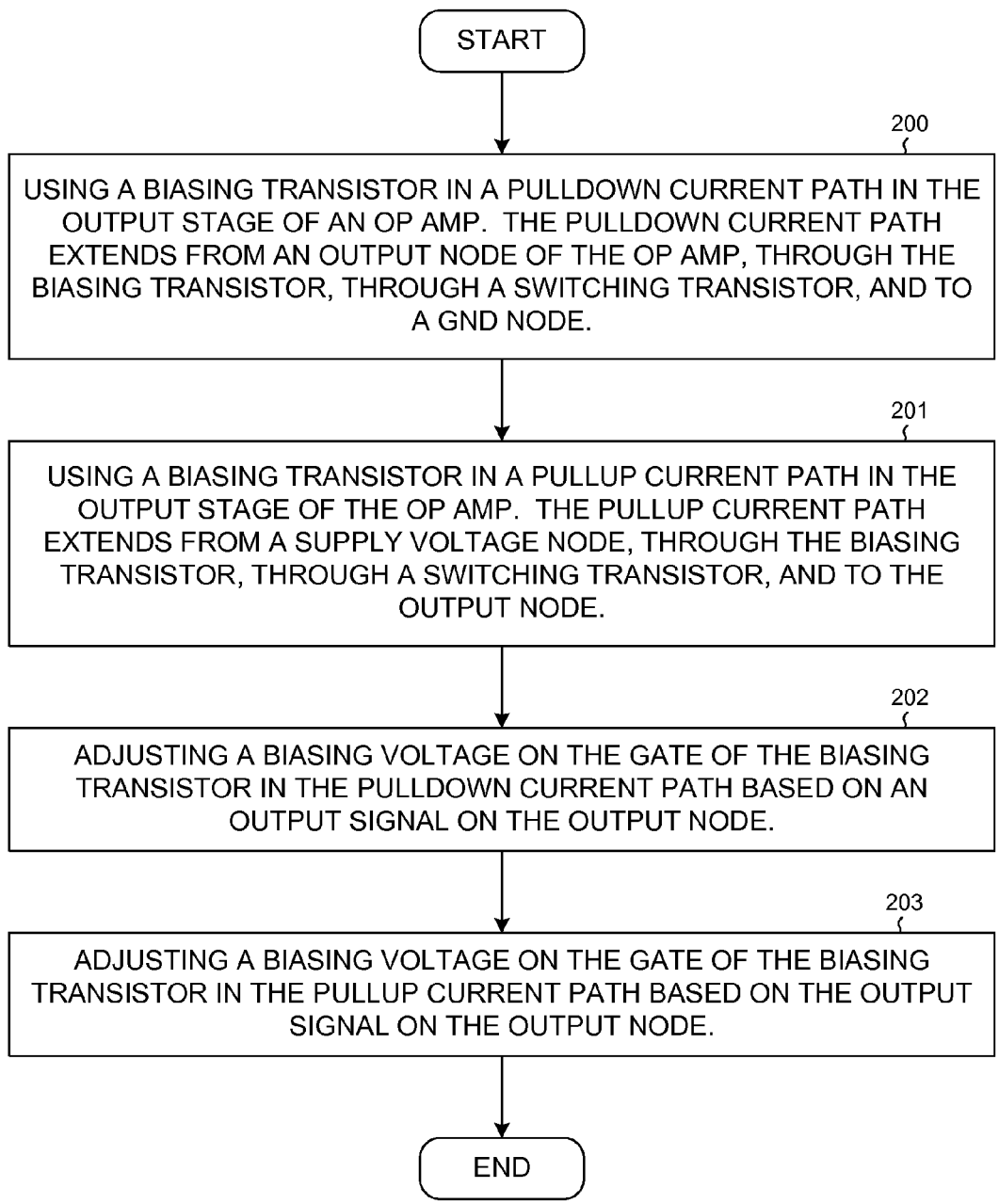
FIG. 13 is a flowchart of a method in accordance with one novel aspect.

FIG. 13 is a simplified flowchart of a method in accordance with one novel aspect. An N-channel biasing transistor is used (step 200) in a pulldown current path in the output stage of an operational amplifier. The pulldown current path extends from an output node, through the N-channel biasing transistor, through an N-channel switching transistor, and to a ground node. In one example of the method, the N-channel biasing transistor is transistor T2 of FIG. 9, the N-channel switching transistor is transistor T1 of FIG. 9, and the output node is node N7 of FIG. 9.

A P-channel biasing transistor is used (step 201) in a pullup current path in the output stage of the operational amplifier. The pullup current path extends from the output node, through the P-channel biasing transistor, through a P-channel switching transistor, and to a ground node. In one example of the method, the P-channel biasing transistor is transistor T4 of FIG. 9, the P-channel switching transistor is transistor T3 of FIG. 9, and an analog supply voltage VDDA is present between the supply voltage node N10 and the ground node N11.

The voltage on the gate of the N-channel biasing transistor in the pulldown current path is adjusted (step 202) based on an output signal on the output node. In one example, the voltage is set at one of two discrete biasing voltages depending on whether the output voltage VOUT on node N7 of FIG. 9 is above or below a first predetermined voltage. If VOUT is smaller than the first predetermined voltage, then the voltage on the gate of the N-channel biasing transistor is set at the smaller of the two discrete biasing voltages (for example, one third of VDDA), otherwise the voltage on the gate is set at the larger of the two discrete biasing voltages (for example, one half of VDDA).

The voltage on the gate of the P-channel biasing transistor in the pullup current path is adjusted (step 203) based on the output signal. In one example, the voltage is set at one of two discrete biasing voltages depending on whether the output voltage VOUT on node N7 of FIG. 9 is above or below a second predetermined voltage. If VOUT is larger than the second predetermined voltage, then the voltage on the gate of the P-channel biasing transistor is set at the larger of the two discrete biasing voltages (for example, two thirds of VDDA), otherwise the voltage on the gate is set at the smaller of the two discrete biasing voltages (for example, one half of VDDA).

Although certain specific embodiments are described above for instructional purposes, the teachings of this patent document have general applicability and are not limited to the specific embodiments described above. Although a voltage divider technique and circuit is described above as a way to adjust a biasing voltage based on output signal VOUT, other techniques and circuits can be used. If a voltage divider is used, it need not involve a string of diode-connected transistors. The voltage dividers of adaptive biasing circuit 126 may, for example, involve strings of resistors. The pulldown current path and the pullup current path are said to exist in the output stage circuit even though little or no current might actually be flowing through one of the current paths when the operational amplifier is driving the output signal VOUT to one of the supply rail voltages. Although the sources of the switching transistors T1 and T3 are illustrated in FIG. 9 as being directly connected to supply voltage rails (VDDA and GND), the sources of these transistors can be coupled to the rails through other enable transistors such as is illustrated in the more detailed diagram of FIG. 8. Accordingly, various modifications, adaptations, and combinations of the various features of the described specific embodiments can be practiced without departing from the scope of the claims that are set forth below.

What is claimed is:

1. An operational amplifier comprising:
   a first power supply node;
   a second power supply node, wherein a supply voltage is present between the first power supply node and the second power supply node;
   an amplifier output node;
   a differential input stage;
   an output stage comprising:
      a first transistor having a source, a gate and a drain;
      a second transistor having a source, a gate and a drain, wherein the amplifier can couple the amplifier output node to the second power supply node through a first conductive path, wherein the first conductive path extends from the output node, through the second transistor, through the first transistor, and to the second power supply node;
      a third transistor having a source, a gate and a drain;
      a fourth transistor having a source, a gate and a drain, wherein the amplifier can couple the amplifier output node to the first power supply node through a second conductive path, wherein the second conductive path extends from the first power supply node, through the third transistor, through the fourth transistor and to the amplifier output node, wherein each of the first, second, third and fourth transistors has a drain-to-source breakdown voltage that is lower than the supply voltage, and wherein each of the first, second, third and fourth transistors has a gate-to-source breakdown voltage that is lower than the supply voltage; and
   an adaptive biasing circuit that supplies a first bias signal onto the gate of the second transistor and that supplies a second bias signal onto the gate of the fourth transistor, wherein the first bias signal has a first voltage if an output signal on the amplifier output node is in a first voltage range, and wherein the adaptive biasing circuit increases the first bias signal if the amplifier output signal is in a second voltage range, wherein the second bias signal has a third voltage if an output signal on the amplifier output node is in a third voltage range, and wherein the adaptive biasing circuit decreases the second bias signal if the output signal is in the second voltage range.

2. The operational amplifier of claim 1, wherein the drain of the first transistor is connected to the source of the second transistor, wherein the drain of the second transistor is connected to the output node, wherein the drain of the third transistor is connected to the source of the fourth transistor, and wherein the drain of the fourth transistor is connected to the output node.

3. The operational amplifier of claim 1, wherein the output signal has a voltage swing that is substantially equal to the supply voltage, and wherein none of the first, second, third and fourth transistors experiences a drain-to-source voltage that exceeds the drain-to-source breakdown voltage, and wherein none of the first, second, third and fourth transistors experiences a gate-to-source voltage that exceeds the gate-to-source breakdown voltage.

4. The operational amplifier of claim 2, wherein the adaptive biasing circuit comprises:
   a first voltage divider circuit having a first node and a second node, wherein the first node is coupled to the gate of the second transistor;
   a first bias-adjusting transistor having a source, a gate, and a drain, wherein the source is connected to the first node, wherein the drain is connected to the second node, and wherein the gate is connected to the output node;
   a second voltage divider circuit having a first node and a second node, wherein the first node is coupled to the gate of the fourth transistor; and
   a second bias-adjusting transistor having a source, a gate, and a drain, wherein the source is connected to the first node, wherein the drain is connected to the second node, and wherein the gate is connected to the output node.

5. The operational amplifier of claim 4, wherein the first voltage divider comprises:
   a first diode-connected transistor having a source, a gate and drain, wherein the drain is connected to the first power supply node, and wherein the source is connected to the first node of the first voltage divider circuit;

a second diode-connected transistor having a source, a gate and drain, wherein the drain is connected to the source of the first diode-connected transistor, and wherein the source is connected to the second node of the first voltage divider circuit; and a third diode-connected transistor having a source, a gate and drain, wherein the drain is connected to the source of the second diode-connected transistor.

6. The operational amplifier of claim 1, wherein the differential input stage has a first differential input node, a second differential input node, a first output node and a second output node, wherein the first output node of the differential input stage is connected to the gate of the first transistor of the output stage; and wherein the second output node of the differential input stage is connected to the gate of the third transistor of the output stage.

7. The operational amplifier of claim 6, wherein the differential input stage includes a differential stage and a class AB control circuit.

8. The operational amplifier of claim 1, wherein the source of the first transistor is coupled to the second power supply node through a first enable transistor, and wherein the source of the third transistor is coupled to the first power supply node through a second enable transistor.

9. A method comprising:
(a) using an N-channel biasing transistor in a pulldown current path in an output stage of an operational amplifier, wherein the pulldown current path extends from an output node of the operational amplifier, through the N-channel biasing transistor, through an N-channel switching transistor, and to a second supply voltage node;
(b) using a P-channel biasing transistor in a pullup current path in the output stage of the operational amplifier, wherein the pullup current path extends from a first supply voltage node, through a P-channel switching transistor, through the P-channel biasing transistor, and to a first supply voltage node;
(c) adjusting a biasing voltage on a gate of the N-channel biasing transistor based on an output signal on the output node; and
(d) adjusting a biasing voltage on a gate of the N-channel biasing transistor based on the output signal on the output node.

10. The method of claim 9, wherein the adjusting of (c) involves decreasing the biasing voltage on the gate of the N-channel biasing transistor when a voltage of the output signal falls below a predetermined voltage, and wherein the adjusting of (c) further involves increasing the biasing voltage on the gate of the N-channel biasing transistor when a voltage of the output signal rises above the predetermined voltage.

11. The method of claim 10, wherein a drain of the switching P-channel transistor is coupled to a source of the P-channel biasing transistor, wherein a drain of the P-channel biasing transistor is coupled to the output node, wherein the output node is coupled to a drain of the N-channel biasing transistor, and wherein a source of the N-channel biasing transistor is coupled to a drain of the N-channel switching transistor.

12. The method of claim 11, further comprising:
(e) powering the output stage from a supply voltage VDDA, wherein the N-channel biasing transistor, the N-channel switching transistor, the P-channel biasing transistor, and the P-channel switching transistors all have drain-to-source breakdown voltages that are less than the supply voltage VDDA.

13. The method of claim 12, wherein the supply voltage VDDA is present between the first and second supply voltage nodes.

14. The method of claim 12, wherein the supply voltage VDDA is present between a VDDA supply voltage rail and a ground rail, wherein a first enabling transistor couples the VDDA supply voltage rail to the source of the P-channel switching transistor, and wherein a second enabling transistor coupled the ground rail to the source of the N-channel switching transistor.

15. The method of claim 10, wherein the increasing of the biasing voltage is accomplished by short circuiting a resistive element in a voltage divider, wherein a node of the voltage divider is coupled to the gate of the N-channel biasing transistor.

16. The method of claim 9, wherein the biasing voltage on the gate of the N-channel biasing transistor is generated using a voltage divider.

17. A circuit comprising:
an operational amplifier output node;
a supply voltage node;
a ground node;
an N-channel switching transistor and an N-channel biasing transistor coupled together in series such that if the N-channel switching transistor and the N-channel biasing transistor are conductive a current path exists from the output node to the ground node through the N-channel switching transistor and the N-channel biasing transistor;
an P-channel switching transistor and an P-channel biasing transistor coupled together in series such that if the P-channel switching transistor and the P-channel biasing transistor are conductive a current path exists from the supply voltage node to the output node through the P-channel switching transistor and the P-channel biasing transistor;
first means for adjusting a first biasing voltage on a gate of the N-channel biasing transistor based at least in part on a voltage on the output node, wherein the first means decreases the first biasing voltage when the voltage on the output node decreases below a first predetermined voltage; and
second means for adjusting a second biasing voltage on a gate of the P-channel biasing transistor based at least in part on the voltage on the output node, wherein the second means decreases the second biasing voltage when the voltage on the output node increases above a second predetermined voltage.

18. The circuit of claim 17, wherein the first means sets the first biasing voltage at a first voltage if the voltage on the output node is below the first predetermined voltage and sets the first biasing voltage at a second voltage if the voltage on the output node is above the first predetermined voltage.

19. The circuit of claim 18, wherein the first means includes a voltage divider, and wherein the voltage divider includes a string of diode-connected transistors.

20. The circuit of claim 17, wherein a supply voltage VDDA is present between the supply voltage node and the ground node, and wherein the N-channel biasing transistor, the N-channel switching transistor, the P-channel biasing transistor, and the P-channel switching transistors all have drain-to-source breakdown voltages that are less than the supply voltage VDDA.

21. An amplifier comprising:
a differential input stage; and
an output stage comprising:
a first transistor;

a second transistor, wherein the amplifier can couple an output node to a ground node through a first conductive path that extends from the output node, through the second transistor, through the first transistor, and to the ground node;

a third transistor;

a fourth transistor, wherein the amplifier can couple the output node to a supply voltage node through a second conductive path that extends from the supply voltage node, through the third transistor, through the fourth transistor and to the output node, and wherein each of the first, second, third and fourth transistors has a drain-to-source breakdown voltage that is lower than a supply voltage between the supply voltage node and the ground node; and a circuit adapted to adaptively bias voltages on gates of the first and fourth transistors based on a voltage on the output node.

* * * * *